(12) United States Patent
Wyatt et al.

(10) Patent No.: US 6,851,018 B2
(45) Date of Patent: Feb. 1, 2005

(54) EXCHANGING OPERATION PARAMETERS BETWEEN A DATA STORAGE DEVICE AND A CONTROLLER

(75) Inventors: Stewart R. Wyatt, Boise, ID (US); Robin Alexis Takasugi, Eagle, ID (US); Kenneth K. Smith, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 174 days.

(21) Appl. No.: 10/107,560

(22) Filed: Mar. 27, 2002

(65) Prior Publication Data

US 2003/0188091 A1 Oct. 2, 2003

(51) Int. Cl.[7] ............................................... G06F 12/00
(52) U.S. Cl. ...................................... 711/111; 711/154
(58) Field of Search ................................. 711/104, 105, 711/111, 165, 154; 710/5; 365/185.09, 185.22, 189.01

(56) References Cited

U.S. PATENT DOCUMENTS

| | | | | |
|---|---|---|---|---|
| 6,021,076 A | * | 2/2000 | Woo et al. | ................... 365/211 |
| 6,094,368 A | * | 7/2000 | Ching | ......................... 356/49 |
| 6,351,412 B1 | * | 2/2002 | Nozoe et al. | .......... 365/185.09 |
| 6,363,454 B1 | * | 3/2002 | Lakhani et al. | ............. 711/100 |
| 6,614,690 B2 | * | 9/2003 | Roohparvar | ........... 365/185.22 |

OTHER PUBLICATIONS

Jeff Bachiochi, Get SmartMedia, Part 1: What's It All About?, Circuit Cellar, Issue 110, Sep. 1999.*
Jeff Bachiochi; From the Bench, Get SmartMedia, Part 1: What's It All About?; Circuit Cellar, Issue 110, Sep., 1999; pp. 80–83.
SmartMedia Seminar in Taipei, ROC; Jun. 21, 2000; pp. 1–64.
Toshiba Document No.: TC5816BDC; Toshiba MOS Digital Integrated Circuit Silicon Gate CMOS; Nov. 7, 1998; pp. 1–36.

* cited by examiner

Primary Examiner—Pierre M. Vital (57) ABSTRACT

In a data storage and retrieval system, a method and system for exchanging operation parameters between a data storage device and a storage device controller is disclosed. A memory device within the data storage device comprises operation parameter registers, which store operation parameters that are indicative of environmental conditions and characteristics of the memory device itself. The operation parameter registers may be readable and writable. To initiate an exchange of operation parameters, the storage device controller sends a command code indicative of an operation parameter exchange command and designates an address in the operation parameter registers to which operation parameters are to be written or from which operation parameters are to be read.

29 Claims, 4 Drawing Sheets

EXCHANGING OPERATION PARAMETERS BETWEEN A DATA STORAGE DEVICE AND A CONTROLLER

FIELD OF THE INVENTION

The present invention is generally related to data storage devices. More particularly, the present invention is related to a system and apparatus for exchanging information between a data storage device and a controller.

BACKGROUND OF THE INVENTION

The SmartMedia™ digital data storage card (also known as a "Solid State Floppy Disk Card" (SSFDC)) is a removable data storage medium developed in recent years to store data in various portable electronic devices, such as digital cameras, digital camcorders, personal digital assistants (PDAs), digital audio players, cellular telephones, pagers, etc. Several manufacturers have independently developed versions of this removable storage medium that conform to the SmartMedia™ specifications with respect to its physical size, shape, and pin assignments. In addition to different versions developed by manufacturers, SmartMedia™ storage devices have been developed in packages comprising different amounts of storage capacity. Currently, a range of storage capacities from 2 megabytes (MB) to 128MB is available, with anticipation of even greater storage capacities in the future.

Since a consumer may choose from a number of different manufacturers and storage capacities of SmartMedia™ storage devices for use in the consumer's electronic device, the SmartMedia™ specifications provide a way to identify the manufacturer and product number. When the electronic device is first turned on, the electronic device initiates what is known as an "ID Read" command. By requesting this command, a controller within the electronic device receives from the SmartMedia™ storage device a "Maker Code Output," which is indicative of the manufacturer of the memory product, and a "Device Code Output," which is indicative of the model or product number. This information may be used to determine the type and storage capacity of the storage device.

In order for the controller of the electronic device to initiate the ID Read command, the controller sends command code 90h and address 00h to the SmartMedia™ storage device. Then the controller asserts a read enable signal, and the SmartMedia™ storage device outputs the Maker Code Output to the controller. The controller asserts a read enable signal a second time, and the SmartMedia™ storage device outputs the Device Code Output. As mentioned above, the ID Read command is typically performed when the electronic device is powered up so that the controller can identify the type of SmartMedia™ storage device with which it is dealing. From the manufacturer and model number, the controller may determine the data storage capacity and may also store "revisions" that include instructions for working around known peculiarities of certain SmartMedia™ storage devices.

The conventional ID Read is limited in its use in that only a couple pieces of information can be communicated from the storage device to the electronic device. Furthermore, the Maker Code and Device Code information must be decoded by the electronic device to understand what the codes represent.

SmartMedia™ typically utilizes NAND flash memory chips to store data. However, as alternatives to NAND flash memory are developed to accommodate controller functionality, which is absent from NAND flash, a need arises to allow for more communication between the storage device and the controller. With new types of memory being developed, a need arises for an exchange of information relating to new configuration parameters. Furthermore, the prior art is not capable of communicating a sufficient number of parameters to account for various operating and environmental conditions, and for updating parameters when conditions change.

SUMMARY OF THE INVENTION

The present disclosure relates to systems and methods for exchanging operation parameters between a controller and a memory device. One example of a system for exchanging operation parameters comprises a memory device having data registers and a plurality of operation parameter registers. This example system also comprises a controller and a bus connecting the controller to the memory device. The operation parameter registers may be configured to be readable or writable, thereby allowing operation parameters to be written to or read from the operation parameter registers. The operation parameters exchanged between the controller and the memory device may be indicative of environmental conditions, such as temperature and humidity, or may be indicative of characteristics of the memory device.

An example of a method for exchanging operation parameters comprises the following steps. An operation parameter exchange command is sent to the memory device to indicate a request for an exchange between the controller and the operation parameter registers. An address in the operation parameter registers is designated as a selected address to be involved in the operation parameter exchange. When the address has been designated, the exchange takes place between the selected address in the operation parameter registers and the controller. The exchange may include the writing of operation parameters to the operation parameter registers or reading operation parameters from the operation parameter registers.

BRIEF DESCRIPTION OF THE DRAWINGS

Many aspects of the invention can be better understood with reference to the following drawings. Like reference numerals designate corresponding parts throughout the several views.

DETAILED DESCRIPTION OF THE INVENTION

The SmartMedia™ digital data storage cards have specific size, shape, and pin location specifications as explained in the description of Toshiba's TC58168DC product "Toshiba MOS Digital Integrated Circuit Silicon Gate CMOS 16 Mbit (2M×8 bit) CMOS NAND EEPROM (2M Byte SmartMedia™)," printed from the internet on Feb. 21, 2002, which is hereby incorporated by reference into the present disclosure. These specifications allow various manufacturers to make different types of data storage devices that may be electrically connected to electronic devices such as digital cameras, digital audio players, cellular phones, etc.

Typically, the SmartMedia™ cards comprise NAND flash memory chips for storing digital data. Alternatives to NAND flash are being developed, such as magnetoresistive random access memory (MRAM), which comprise an embedded controller. With the advent of new types of storage media in SmartMedia™ cards, more communication between the storage device and the controller is desirable to account for various operating characteristics of different types of storage devices and to account for changeable environmental conditions.

Disclosed is a system that, in addition to accepting the ID Read command, is capable of providing a greater exchange of information between the data storage device and controller. In addition, the system is capable of writing information related to environmental conditions and device configurations to the data storage device. The information that is exchanged between the controller and the data storage device will hereinafter be referred to as "operation parameters." As is discussed in greater detail below, the operation parameters may be written to operation parameter registers within the data storage device and read from the operation parameter registers.

Figure 1:
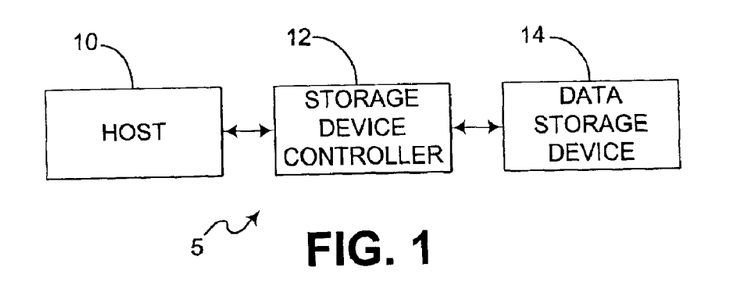
FIG. 1 is a block diagram illustrating an embodiment of a data storage and retrieval system.

FIG. 1 illustrates an embodiment of a data storage and retrieval system 5 that can be used to read and write data in memory. As shown in FIG. 1, the data storage and retrieval system 5 includes a host 10, which can be a portable electronic device such as a digital camera, personal digital assistant (PDA), cellular telephone, etc. The host 10 may alternatively be a testing system used during the manufacturing of a data storage device 14. The host 10 may write new data into a data storage device 14 via a storage device controller 12, which may encode the data to allow error detection and correction functionality. The host 10 may also read data from the data storage device 14 using the storage device controller 12.

The data storage and retrieval system 5 may further have the capability to exchange information between the storage device controller 12 and the data storage device 14 without the knowledge of the host 10. In this case, the information exchanged between the storage device controller 12 and the data storage device 14 includes parameters that are indicative of the environmental conditions in which the data storage and retrieval system 5 operates. The exchanged parameters may also be indicative of fixed or changeable characteristics of the data storage device 14. The storage device controller 12 may use the parameters to provide efficient operation by configuring hardware within the storage device controller 12 to accommodate the specifications of the data storage device 14. The storage device controller 12 may also write newly determined parameters into the data storage device 14 to update the parameters when conditions may change.

The storage device controller 12 may be configured in a number of ways. For instance, the storage device controller 12 may be configured separately from both the host 10 and data storage device 14. On the other hand, the storage device controller 12 may be configured integrally with either the host 10 or the data storage device 14, depending on the desired application. In an embodiment in which the data storage device 14 merely comprises data storage cells and no processor, the storage device controller 12 may be included as part of the host 10 such that a processor within the host 10 may provide data management functions. Alternatively, the storage device controller 12 may be part of the data storage device 14 itself such as in the case when the data storage device 14 comprises a controller, e.g., CompactFlash™, MultiMedia™ cards (MMC), SecureDigital™, etc.

Figure 2:
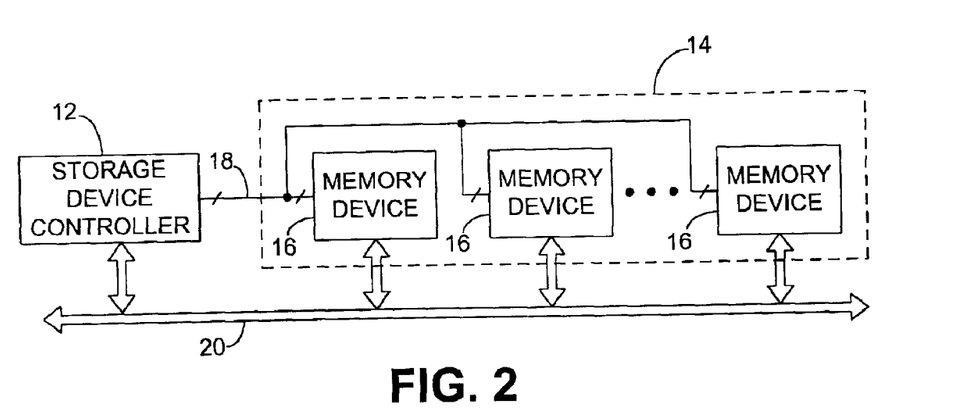
FIG. 2 is a block diagram illustrating an embodiment of interconnections between the storage device controller and data storage device shown in FIG. 1.

FIG. 2 is a block diagram of the storage device controller 12 and an example embodiment of the data storage device 14. FIG. 2 also shows the interconnections between the storage device controller 12 and the components within the data storage device 14. In the embodiment mentioned above, wherein the storage device controller 12 is integrally formed with the data storage device 14, the interconnections can be formed as permanent contacts that are not removable. In an alternative embodiment in which the storage device controller 12 is part of the host 10 and separate from the data storage device 14, the interconnections can be configured to include removable terminals (not shown). In such a case, electrical connection is made when the data storage device 14 is inserted into a receptacle (not shown) of the host 10.

The data storage device 14 shown in FIG. 2 may include one or more memory devices 16, which store digital data. The storage device controller 12 may access the memory devices 16 via enable lines 18, which are described below in greater detail with respect to FIG. 3. In addition to the enable lines 18, bus 20 provides further interconnection between the storage device controller 12 and memory devices 16. By way of example, the bus 20 may be capable of passing 8-bit parallel data between the storage device controller 12 and the memory devices 16.

Figure 3:
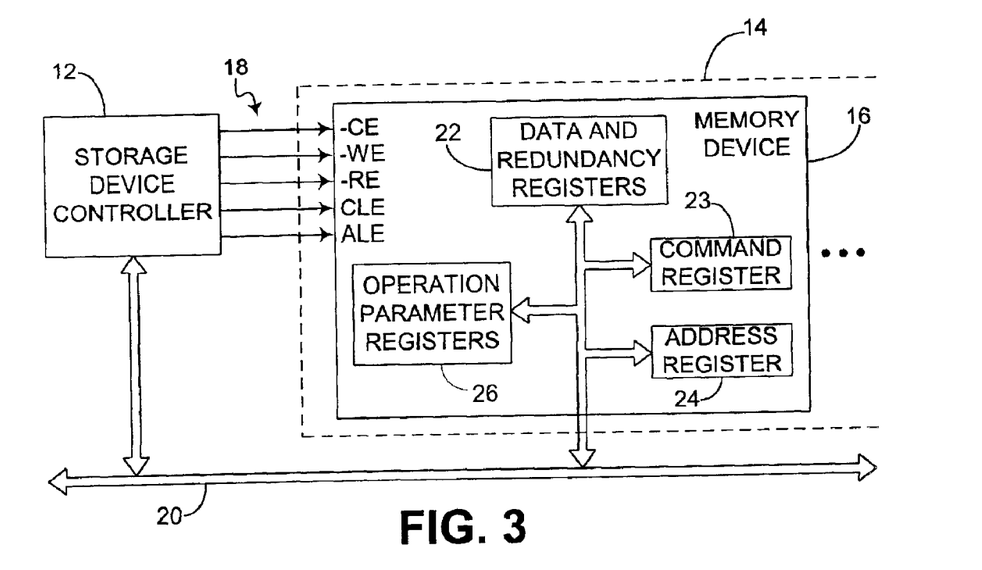
FIG. 3 is a block diagram illustrating an embodiment of the interconnections and the memory device shown in FIG. 2.

FIG. 3 illustrates a more detailed view of an embodiment of the memory device 16 and an example of enable lines 18 between the storage device controller 12 and the memory devices 16. Although only one memory device 16 is illustrated in FIG. 3, it is to be understood that more than one memory device 16 may be used in the data storage device 14, as described above and as illustrated in FIG. 2. It is also to be understood that the same enable lines 18 connected to a first memory device 16 may also be connected to the same respective enable terminals of other memory devices 16 where multiple memory devices 16 are provided.

Although the storage device controller 12 is shown in FIG. 3 as being able to acces multiple memory devices 16, the system may be configured in a manner in which only one memory device 16 is accessed by the storage device controller 12 so as to simplify the interconnections between the storage device controller 12 and the data storage device 14. Alternatively, accessible information may be stored on some or all of the memory devices 16. Such an embodiment would typically include interconnections between the storage device controller 12 and the memory devices 16 that store the information to be exchanged. The interconnections may also comprise daisy-chain connections through intermediate memory devices 16.

The storage device controller 12 enables certain functions of the memory device 16 by sending signals along enable lines 18. One of the enable lines 18 illustrated in FIG. 3 is a chip enable (−CE) line, which carries a signal from the storage device controller 12 to the −CE terminal of the particular memory device 16 to be enabled. The symbol (−) indicates that a logic low signal enables the memory device 16. The storage device controller 12 outputs a logic high signal along the −CE line to put the memory devices 16 in a standby mode. Typically, the storage device controller 12 enables one memory device 16 at a time.

A second one of the enable lines 18 is a write enable (−WE) line, which is connected to the −WE terminal of the memory device 16. The −WE terminal, like the −CE terminal, is active low (i.e., enabled by a logic low signal). When the memory device 16 is write enabled, the storage device controller 12 may write data to the memory device 16.

Another of the enable lines 18 includes a read enable (−RE) line connected to the −RE terminal. The storage device controller 12 provides a logic low signal to the −RE terminal to allow data or operation parameters stored in the memory device 16 to be read.

The next enable line 18 shown in FIG. 3 is the command latch enable (CLE) line, which is connected to the CLE terminal of the memory device 16. An active high signal along the CLE line enables the memory device 16 to input a command code from the bus 20 into its command register 23.

The last enable line 18 shown in FIG. 3 is the address latch enable (ALE) line, which is connected to the ALE terminal of the memory device 16. The ALE terminal is active high (i.e., enabled by a logic high signal). Upon receiving a logic high signal at the ALE terminal, the memory device 16 inputs address data on the bus 20 into an address register 24 of the memory device 16.

The purpose of the various enable lines 18 having been described, reference is now made to the registers within the memory device 16 shown in FIG. 3. The embodiment of the memory device 16 shown in FIG. 3 includes four types of registers. The first registers are the data and redundancy registers 22, which store the user's data plus the added redundancy bytes encoded with the data. The redundancy bytes provide error detecting and correcting capabilities and are stored along with the data.

In addition to the data and redundancy registers 22, the memory device 16 comprises a command register 23, an address register 24, and operation parameter registers 26. Reference is first made to the command register 23. When the CLE terminal receives a logic high signal, the command register 23 is enabled to read the 8-bit command code from the bus 20. The command code may be indicative of requests to perform certain functions, such as reading, writing, etc. In response to reading the command code, the command register 23 initiates the requested command. Furthermore, the command register 23 shown in FIG. 3 responds to a command to exchange operation parameters between the controller and the operation parameter registers, hereinafter referred to as an "operation parameter exchange" command. The command register 23 responds to an operation parameter exchange command by configuring the memory device 16 to exchange operation parameters between the storage device controller 12 and the operation parameter registers 26.

The address register 24 receives an address from the bus 20. The received address may be an address to be accessed within the data and redundancy registers 22 or within the operation parameter registers 26. When the ALE terminal is high, the address register reads the address code from the bus 20.

The operation parameter register 26 may be accessed by requesting an operation parameter exchange command. To maintain consistency with the conventional ID Read, the operation parameter exchange command may use the 8-bit command code 10010000, which may be written in hexadecimal form as 90h . However, other command codes, making a distinction from the typical read and write commands, may be used. The memory device 16 is configured to respond to an operation parameter exchange command on the basis of whatever predefined command code is established between the storage device controller 12 and the memory device 16. The predefined command code may be different for each of the memory devices 16 so that the storage device controller 12 may access a specific memory device 16.

During a conventional read or write command, the address register 24 accesses addresses within the data and redundancy registers 22. However, after the command register 23 has received the predefined command code requesting access to the operation parameter registers 26, the address register 24 receives an address corresponding to an address within the operation parameter registers 26. The accessed address within the operation parameter registers 26 may be an address to which operation parameters are written, from which operation parameters are read, or both. In the present disclosure, the addresses 01h to FFh are available for storing operation parameters, since the address 00h is already used for the ID Read command. Each address in the operation parameter registers 26 may be, for instance, capable of storage 16 bits (2 bytes) of operation parameter information.

The operation parameter registers 26 may comprise any number of registers. Since the conventional address register 24 typically comprises eight bits (written in hexadecimal form as a number from 00h to FFh), it may be desirable to configure the memory device 16 to contain 256 operation parameter registers 26. It should be understood that fewer operation parameter registers 26 may be provided within the memory device 16. Furthermore, in an embodiment in which the address register 24 is more than eight bits wide, more operation parameter registers 26 may be utilized. Another embodiment may include reading two or more 8-bit addresses into the address register 24 in two or more cycles to thereby allow access to 64 K or more addresses within the registers.

The operation parameter registers 26 described herein provide registers that are separate from the data and redundancy registers 22. However, an alternative embodiment may be configured wherein the operation parameter registers 26 replace a number of the data and redundancy registers 22 as they currently exist. In this alternative embodiment, it may be desirable to increase the size of the data and redundancy register 22 or to re-configure or re-assign the data and redundancy registers 22 to accommodate the operation parameter registers 26 in a particular location. The storage device controller 12 in this case accesses the operation parameter registers 26 using a specific code in a manner similar to the accessing of the operation parameter registers 26 when separated from the data and redundancy registers 22.

After the storage device controller 12 has accessed an address within the operation parameter registers 26, the storage device controller 12 may either perform a read command or a write command. During a read command, the storage device controller 12 reads operation parameters from the accessed address within the operation parameter registers 26. During a write command, the storage device controller 12 writes new operation parameters into the accessed address within the operation parameter registers 26.

As noted above, the term "operation parameter" is used herein to refer to the information exchanged between the storage device controller 12 and the operating parameter registers 26 of the memory device 16. The term will now be defined in greater detail. Operation parameters refer to parameters that may be indicative of numerous conditions or characteristics of the environment in which the memory device 16 is used or of the memory device 16 itself. Preferably, operation parameters do not include user data, but include parameters that may be passed only between the storage device controller 12 and the data storage device 14. Alternatively, it may be desirable to allow the host 10 to access the operation parameters when the memory device is tested during manufacture. Operation parameters may be measured internally or may be set according to operation conditions or configurations of the memory device.

For example, operations parameters may relate to specific characteristics of the memory device 16, such as operating voltage and current levels. Since SmartMedia™ storage devices typically operate at either 3.3V or 5V, an operation parameter may be set to indicate the proper operating voltage level. However, in the case where a storage device is configured to operate at another voltage level, depending on the specifications of the device, an operation parameter may be used to indicate this alternative operating voltage. Other operation parameters may be indicative of recommended current levels during different stages of operation, such as during read, write, or erase operations, or the recommended current level during a stand-by mode, etc.

In addition to voltage and current levels, operation parameters may include other characteristics of the memory device 16, such as operation speed, storage capacity information, manufacturer information, and model or product information. Additional operation parameters may specify acceptable operating temperature ranges and acceptable at-rest temperature ranges.

Some operation parameters may be based on characteristics of the memory device 16 that do not change. Such fixed characteristics may be intentionally designed into the memory device 16 or may be determined during a test of the memory device 16 during manufacture. For fixed characteristics, the operation parameters may be written into read-only registers of the operation parameter registers 26 in order to eliminate the possibility of the fixed characteristics being erased or changed. Like the conventional ID Read command, the operation parameter registers 26 may store read-only Maker Code and Device Code information at address 00h. With the availability of 256 readable and writable registers in the operation parameter registers 26, the one ID Read register may not be necessary since much more information may be communicated to the storage device controller 12.

The data storage device 14 may also store "revisions" for instructing the storage device controller 12 as to the latest work-arounds for a particular product. During manufacturing of the data storage device, certain batches of products may have specific characteristics that can be stored in the status registers. During a test of the memory product, certain parameters stored in the status registers may be updated or modified. In certain cases involving error detection, intervention may be made to enable recovery or sparing of data.

The operation parameters may further include environmental conditions in which the data storage device 14 is operating, including temperature, humidity, etc. It may be desirable to detect and store current environmental conditions so that the storage device controller 12 may re-configure its circuitry to compensate for varying conditions. The storage device controller 12 and the status registers of the data storage device 14 may be connected to any number of internal or external sensor devices (not shown) that sense various parameters. The sensor devices may be configured to operate in conjunction with the memory device 16 by inputting sensed parameters and updating the parameters periodically. Depending on the parameter to be measured and the likelihood of change in the parameter, it may be desirable to update the operation parameter registers 26 at certain intervals of time. Alternatively, the sensors may update the operation parameter registers 26 after a sensed parameter experiences a predetermined amount of change. The storage device controller 12 may read the environmental condition values stored in the operation parameter registers 26 when needed.

In addition to the characteristics of the memory device 16 and environment condition, the operation parameters may also include configuration parameters, which may be used to configure how commands are to be requested, how addresses are to be configured, how the column address and page address cycles are to be read, etc. The configuration parameters may include new operating specifications used by various types of memory components. By having access to these configuration parameters, the storage device controller 12 may be able to customize its circuitry to increase efficiency and to allow flexibility in the types of memory devices that may be used.

Figure 4:
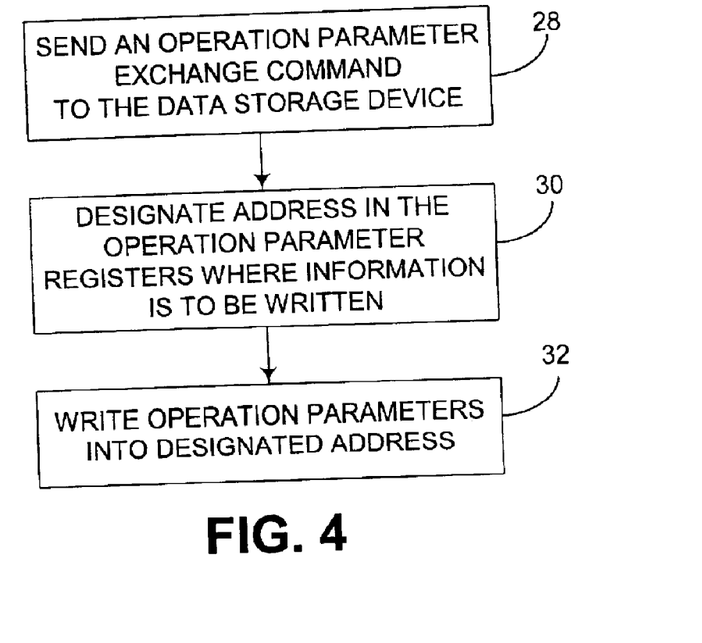
FIG. 4 is a flow diagram illustrating an embodiment of an operation parameter write command that can be used in the system of FIG. 3.
Figure 6:
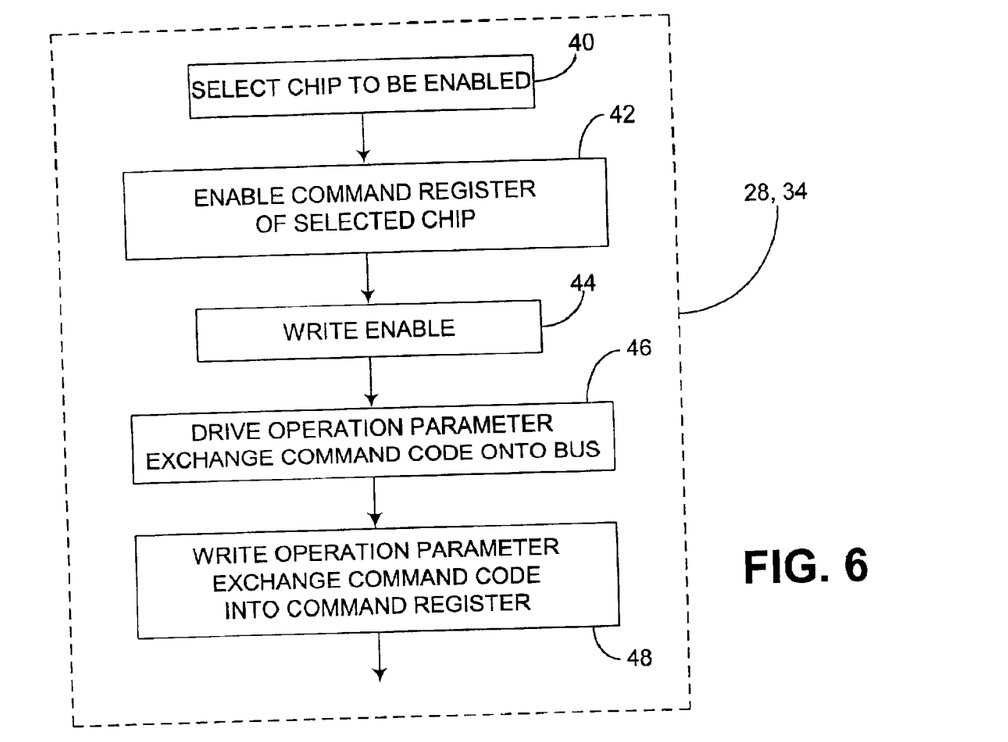
FIG. 6 is a flow diagram illustrating an embodiment for initiating an operation parameter exchange command.
Figure 7:
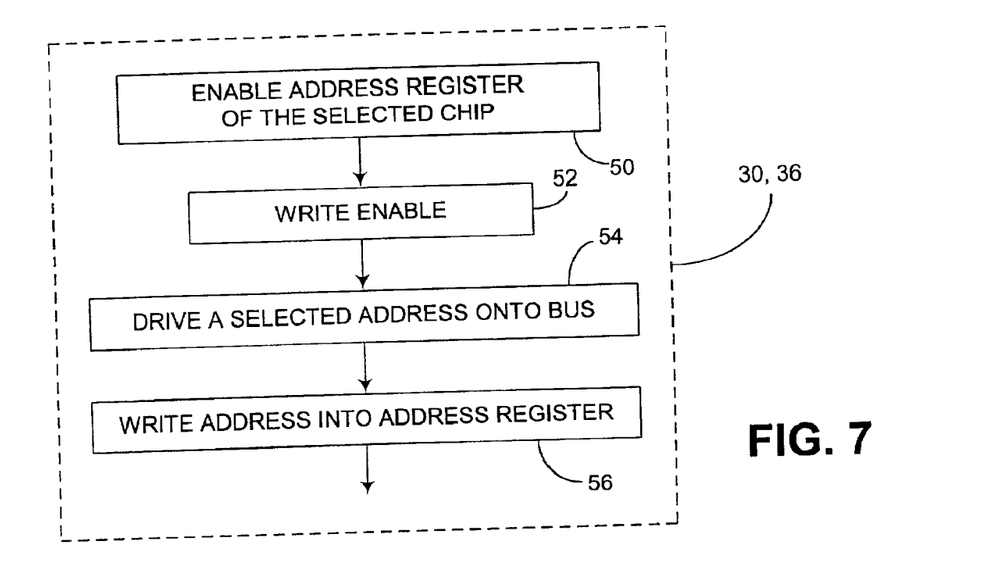
FIG. 7 is a flow diagram illustrating an embodiment for designating an address in operation parameter registers where information is to be exchanged.
Figure 8:
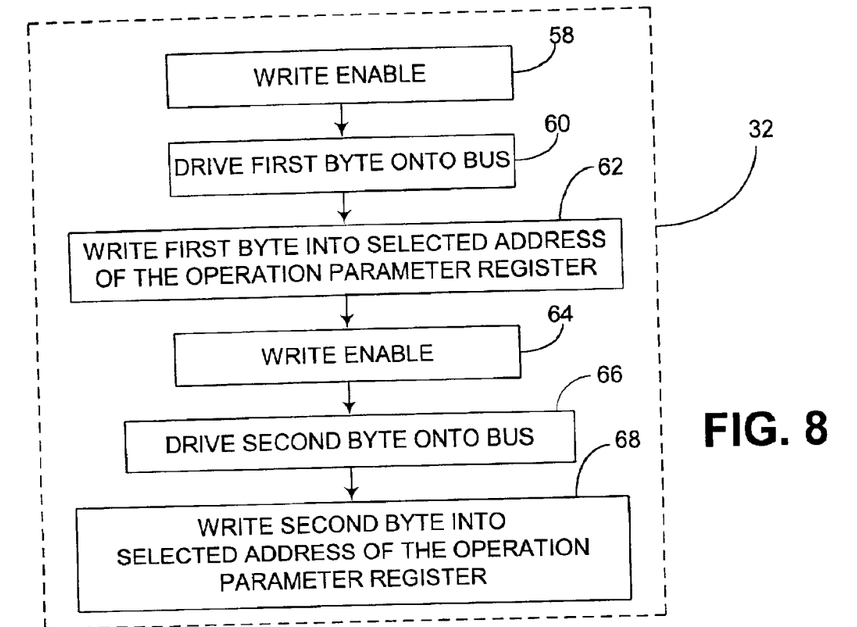
FIG. 8 is a flow diagram illustrating an embodiment for writing operation parameters into the designated address of the operation parameter registers.

Operation of the disclosed invention will now be described with reference to FIGS. 4–9. FIG. 4 is a flow diagram showing the steps of an embodiment of a write command for writing information to the operation parameter registers 26. Each of the steps in FIG. 4 may be described in greater detail with respect to FIGS. 6–8. FIG. 6 is a block diagram of an embodiment of a method for performing the step in block 28 shown in FIG. 4. FIG. 7 is a block diagram of an embodiment of a method for performing the step in block 30 shown in FIG. 4. FIG. 8 is a block diagram of an embodiment of a method for performing the step in block 32 shown in FIG. 4.

Figure 5:
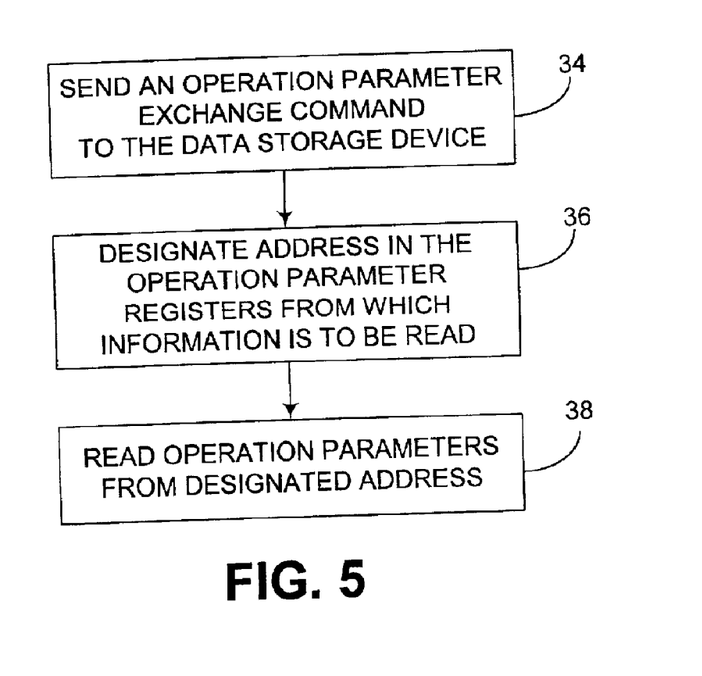
FIG. 5 is a flow diagram illustrating an embodiment of an operation parameter read command that can be used in the system of FIG. 3.

FIG. 5 is a flow diagram illustrating an embodiment of a read command for reading the operation parameters stored in the operation parameter registers 26. The steps in blocks 34, 36, and 38 shown in FIG. 5 may be performed by the steps shown in FIGS. 6, 7, and 9, respectively. It should be noted that FIGS. 6 and 7 may be used for both the writing method defined in FIG. 4 and the reading method defined in FIG. 5.

The writing method defined in FIG. 4 begins with block 28, wherein the storage device controller 12 sends an operation parameter exchange command to the data storage device 14, thereby requesting access to the operation parameter registers 26 of the data storage device 14. For example, the operation parameter exchange command may use command code 90h to indicate a request for an exchange of information (read or write) between the storage device controller 12 and the operation parameter registers 26. Although the command code 90h conforms to the ID Read specification, any arbitrary command code (other than the standard command codes that are used for commands such as read, write, etc.) may be used to designate the operation parameter exchange command. Block 30 shows a step wherein the storage device controller 12 designates an address in the operation parameter registers 26 where new or updated operation parameter information is to be written. Then, the storage device controller 12 writes the operation parameters into the designated address within the operation parameter registers 26 (block 32).

FIG. 5 shows an example embodiment of a read command. In block 34, the storage device controller 12 sends a command code indicative of an operation parameter exchange command to the data storage device 14. Again, the command code 90h, for example, or another arbitrary command code, may be used to designate the command to exchange operation parameters between the storage device controller 12 and the data storage device 14. In the embodiment of FIG. 5, this exchange is a read command. Block 36 indicates a step for designating an address in the operation parameter registers 26 from which an operation parameter is to be read. When the address is designated, the storage device controller 12 reads the operation parameter or parameters from the designated address in the operation parameter registers 26 (block 38).

FIG. 6 shows an embodiment involving a number of steps for carrying out either the step shown in block 28 in the write command of FIG. 4 or the step shown in block 34 in the read command of FIG. 5. The steps of FIG. 6 may be performed to enable a memory device 16 to be selected from the number of memory devices 16 in the data storage device 14 and to initiate an operation parameter exchange command. Block 40 shows a step wherein the storage device controller 12 enables a selected memory device 16 that is to be involved in the operation parameter exchange. The storage device controller 12 enables the selected memory device 16 by outputting a logic low signal on the −CE terminal of the memory device 16. Then the storage device controller 12 enables the command register 23 by sending a logic high signal to the CLE terminal of the selected memory device 16, as indicated in block 42. When the command register 23 is enabled, the storage device controller 12 sends a logic low signal to the −WE terminal to enable writing to the command register 23 (block 44). When the command register 23 is write-enabled, the storage device controller 12 drives an operation parameter exchange command code onto the bus 20 (block 46). For example, the data storage and retrieval system 5 may use command code 90h to initiate the operation parameter exchange command. With the command register 23 write-enabled and the operation parameter exchange command code on the bus, the command code, e.g. 90h, is written into the command register 23 of the memory device 16 (block 48).

FIG. 7 shows an embodiment for carrying out either the step designated by block 30 of FIG. 4 or the step designated by block 36 of FIG. 5. FIG. 7 includes steps for designating an address where operation parameters are to be written to or read from. If the data storage and retrieval system 5 uses command code 90h to designate the operation parameter exchange command, the addresses 01h to FFh may be accessed since the address 00h is already used to designate the ID Read command. In block 50, the storage device controller 12 enables the address register 24 of the selected memory device 16 by sending a logic high signal to the ALE terminal. With the address register 24 enabled, the storage device controller 12 write-enables the address register 24 by outputting a logic low signal on the −WE terminal (block 52). Next, the storage device controller 12 drive an 8-bit address onto the bus 20, thereby designating what address in the operation parameter registers is to be involved in the operation parameter exchange (block 54). The memory device 16 then writes the 8-bit address into the enabled address register 24 (block 56).

FIG. 8 shows several steps that may be performed to satisfy the step indicated in block 32 of FIG. 4 for writing operation parameters into a designated address in the operation parameter registers 26. Block 58 of FIG. 8 shows the step wherein the storage device controller 12 performs a write enable, thereby enabling the writing of operation parameters in the designated address of the operation parameter registers 26. The storage device controller 12 then drives the two bytes of an operation parameter (or operation parameters) onto the bus, one byte at a time. The storage device controller 12 drives the first byte onto the bus 20 (block 60). With the designated address in the operation parameter registers 26 write-enabled, the memory device 16 writes the first byte into the first 8 bits of the selected address of the operation parameter registers 26 (block 62). Then, the storage device controller 12 asserts a write-enable a second time (block 64) and drives the second byte onto the bus (block 66). The memory device 16 then writes this second byte from the bus into the designated address of the operation parameter registers 26. FIG. 8 shows an example wherein the bus is eight bits wide and each register of the operation parameter registers 26 is 16 bits wide, thereby requiring two cycles to write to the operation parameter registers 26. However, other width alternatives may be used, thereby requiring more or fewer writing cycles.

Figure 9:
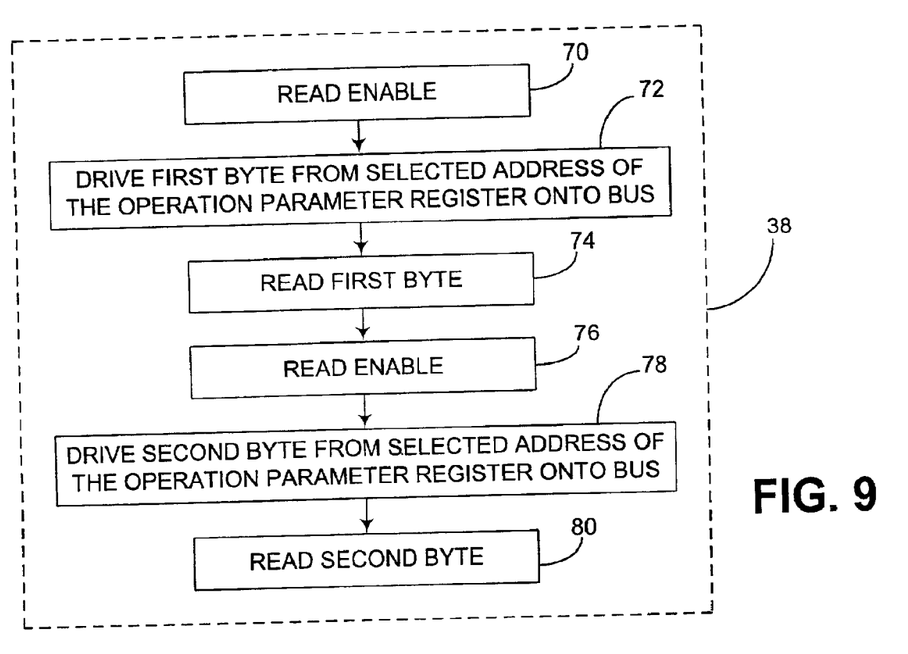
FIG. 9 is a flow diagram illustrating an embodiment for reading operation parameters from the designated address of the operation parameter registers.

FIG. 9 shows the steps that may be performed for reading two bytes from the selected address in the operation parameter registers 26. As mentioned above with respect to FIG. 8, more or fewer cycles may be required if alternative embodiments are utilized involving a bus 20 that is other than eight bits wide and operation parameter registers 26 that are other than 16 bits wide. In block 70, the storage device controller 12 sends a logic low signal to the −RE terminal to read-enable the operation parameter registers 26. Then, the memory device 16 outputs the operation parameters onto the bus 20, one byte at a time. The memory device 16 drives onto the bus 20 the first byte from the first eight bit positions in the selected address of operation parameter registers 26 (block 72). The first byte is then read by the storage device controller 12 (block 74). Blocks 76, 78, and 80 include steps that are similar to the steps in blocks 70, 72, and 74 and perform the reading of the second byte from the last eight bit positions of the selected address in the operation parameter registers 26.

The flow diagrams of FIGS. 4–9 show the functionality and operation of possible implementations of the operation parameter exchange command, which may be written in software. In this regard, each block represents a module, segment, or portion of code, which comprises one or more executable instructions for implementing the specified logical function(s). It should also be noted that in some alternative implementations, the functions noted in the blocks may occur out of the order noted. Two or more blocks shown in succession may in fact be executed substantially concurrently or the blocks may sometimes be executed in the reverse order, depending upon the desired functionality.

The operation parameter exchange command, which comprises an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can contain, store, communicate, propagate, or transport the program for use by or in connection with the instruction execution system, apparatus, or device. The computer-readable medium can be, for example, an electronic, magnetic, optical, electromagnetic, infrared, or semiconductor system, apparatus, device, or propagation medium. Other examples of the computer-readable medium may include the following: an electrical connection having one or more wires, a portable magnetic computer diskette, a random access memory (RAM), a read-only memory (ROM), an erasable programmable read-only memory (EPROM or Flash memory), an optical fiber, or a portable compact disc read-only memory (CDROM). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

It should be emphasized that the above-described embodiments of the present invention are merely possible examples of implementations, merely set forth for a clear understanding of the principles of the invention. Many variations and modifications may be made to the above-described embodiments of the invention without departing substantially from the principles of the invention. All such modifications and variations are intended to be included herein within the scope of this disclosure and protected by the following claims.

We claim:

1. A system for exchanging operation parameters, comprising:
    a host;
    a storage device controller connected to the host;
    a memory device connected to the storage device controller, the memory device comprising data registers for storing data that is accessed by the host via the storage device controller, the memory device further comprising operation parameter registers for storing operation parameters that is are accessed by the storage device controller; and
    a bus connected between the storage device controller and the memory device;
    wherein the operation parameters comprise information related to at least one of an acceptable range of an environmental condition of the memory device, a reading of the environmental condition of the memory device, an operating speed of the memory device, and a storage capacity of the memory device; and
    wherein the operation parameters further comprise configuration parameters for enabling the storage device controller to configure how commands are requested, how addresses are configured, and how column address and page address cycles are to be read.

2. The system of claim 1, wherein the data registers are configured to store data bytes and redundancy bytes.

3. The system of claim 1, wherein the memory device further comprises a command register and an address register.

4. The system of claim 3, wherein the storage device controller accesses the operation parameter registers by writing command code 90h into the command register.

5. The system of claim 3, wherein the storage device controller accesses an address within the operation parameter registers by writing into the address register an address code in a range from 01h to FFh.

6. The system of claim 1, wherein the operation parameter registers are readable and writable.

7. The system of claim 1, wherein at least one of the operation parameter registers is a read-only register.

8. The system of claim 1, wherein the operation parameters further comprise information related to at least one of an operating voltage level of the memory device, an operating current level of the memory device, a stand-by current level of the memory device, an acceptable operating temperature range of the memory device, an acceptable at-rest temperature range of the memory device, a reading of ambient temperature of the memory device, an acceptable humidity range of the memory device, and a reading of ambient humidity of the memory device.

9. The system of claim 1, wherein the operation parameters further comprise information related to at least one of the manufacturer of the memory device and a work-around for the memory device based on testing performed during the manufacture of the memory device.

10. The system of claim 1, further comprising at least one sensor device for measuring the environmental condition, storing the measured environmental condition in one of the operation parameter registers, and periodically updating the stored environmental condition with a new measurement of the environmental condition.

11. The system of claim 10, wherein the storage device controller re-configures its circuitry to compensate for a varying environmental condition.

12. A system for exchanging operation parameters within a data storage and retrieval device, comprising:
    means for controlling the transfer of data;
    means for storing data that is accessed by a host via the controlling means and for storing operation parameters that are accessed by the controlling means;
    means for writing operation parameters to the storing means; and
    means for reading operation parameters from the storing means;
    wherein the operation parameters comprise configuration parameters for enabling the controlling means to configure circuitry of the data storage and retrieval device for optimal performance, and wherein the configuration parameters comprise information related to how commands are requested, how addresses are configured, and how column address and page address cycles are to be read.

13. The system of claim 12, wherein the operation parameters further comprise information related to at least one of an operating voltage level of the storing means, an operating current level of the storing means, and a stand-by current level of the storing means.

14. The system of claim 12, wherein the operation parameters further comprise information related to at least one of an acceptable operating temperature range of the storing means, an acceptable at-rest temperature range of the storing means, a reading of ambient temperature of the storing means, an acceptable humidity range of the storing means, a reading of ambient humidity of the storing means, an operating speed of the storing means, and a storage capacity of the storing means.

15. The system of claim 12, wherein the operation parameters further comprise information related to at least one of a manufacturer of the storing means and a work-around for the storing means based on testing performed during the manufacture of the storing means.

16. A method for exchanging operation parameters between a controller and a data storage device, the method comprising:

sending an operation parameter exchange command to a data storage device;

designating an address in operation parameter registers of the data storage device where operation parameters are to be exchanged; and exchanging operation parameters between the designated address and a controller;

wherein the operation parameters comprise configuration parameters for enabling the controller to configure how commands are requested, how addresses are configured, and how column address and page address cycles are to be read.

17. The method of claim 16, wherein exchanging operation parameters comprises writing operation parameters into the designated address in the operation parameter registers.

18. The method of claim 16, wherein exchanging operation parameters comprises reading operation parameters from the designated address in the operation parameter registers.

19. The method of claim 16, wherein sending an operation parameter exchange command further comprises:

selecting a memory device from a number of memory devices in the data storage device;

enabling the selected memory device;

write-enabling the selected memory device;

driving the operation parameter exchange command onto a bus; and writing the operation parameter exchange command from the bus into a command register of the memory device.

20. The method of claim 19, wherein designating an address further comprises:

enabling an address register of the selected memory device;

write-enabling the selected memory device;

driving a selected address onto the bus; and writing the selected address from the bus into the address register.

21. The method of claim 20, wherein exchanging operation parameters further comprises:

write-enabling the selected memory device;

driving a first byte onto the bus;

writing the first byte into the selected address of the operation parameter registers;

write-enabling the selected memory device;

driving a second byte onto the bus; and writing the second byte into the selected address of the operation parameter registers.

22. The method of claim 20, wherein exchanging operation parameters further comprises:

read-enabling the selected memory device;

driving a first byte from the selected address of the operation parameter registers onto the bus;

reading the first byte;

read-enabling the selected memory device;

driving a second byte from the selected address of the operation parameter registers onto the bus; and reading the second byte.

23. The method of claim 16, further comprising:

repeating the sending, designating, and exchanging steps.

24. The method of claim 23, wherein repeating further comprises waiting for environmental conditions to change.

25. The method of claim 16, wherein the operation parameters further comprise information related to at least one of an acceptable operating temperature range of the data storage device, an acceptable at-rest temperature range of the data storage device, a reading of ambient temperature of the data storage device, an acceptable humidity range of the data storage device, a reading of ambient humidity of the data storage device, an operating voltage level of the data storage device, an operating current level of the data storage device, and a stand-by current level of the data storage device.

26. The method of claim 16, wherein the operation parameters further comprise information related to at least one of the manufacturer of the data storage device and a work-around for the data storage device based on testing performed during the manufacture of the data storage device.

27. A computer program, stored on a computer-readable medium, for exchanging information between a controller and a memory device, the computer program comprising:

logic configured to enable a command register of the memory device to receive an operation parameter exchange command;

logic configured to enable an address register of the memory device to receive an address code designating an address in one of a plurality of operation parameter registers within the memory device where operation parameters are to be exchanged;

logic configured to exchange the operation parameters in the designated address in the operation parameter register with the controller;

wherein the operation parameters comprise configuration parameters enabling the controller to customize its circuitry to increase efficiency; and wherein the configuration parameters include information defining how commands are requested, how addresses are configured, and how address and page address cycles are to be read.

28. The computer program of claim 27, wherein the operation parameters comprise information related to at least one of an acceptable range of an environmental condition of the memory device, a reading of the environmental condition of the memory device, an operating voltage level of the memory device, an operating current level of the memory device, a stand-by current level of the memory device, an operating speed of the memory device, and a storage capacity of the memory device.

29. The computer program of claim 28, further comprising logic configured to re-configure circuitry of the controller to compensate for a varying environmental condition.

* * * * *

UNITED STATES PATENT AND TRADEMARK OFFICE
CERTIFICATE OF CORRECTION

| | |
|---|---|
| PATENT NO. | : 6,851,018 B2 |
| APPLICATION NO. | : 10/107560 |
| DATED | : February 1, 2005 |
| INVENTOR(S) | : Stewart R. Wyatt et al. |

It is certified that error appears in the above-identified patent and that said Letters Patent is hereby corrected as shown below:

In column 11, line 45, in Claim 1, after "that" delete "is".

Signed and Sealed this

Twenty-seventh Day of October, 2009

David J. Kappos
*Director of the United States Patent and Trademark Office*